US010748632B2

(12) United States Patent
Yun et al.

(10) Patent No.: US 10,748,632 B2
(45) Date of Patent: Aug. 18, 2020

(54) NONVOLATILE MEMORY DEVICE AND METHOD OF PROGRAMMING WITH BIT LINE PROGRAMMING FORCING VOLTAGE AND PROGRAMMING INHIBITION VOLTAGE

(71) Applicant: SAMSUNG ELECTRONICS CO., LTD., Suwon-si, Gyeonggi-do (KR)

(72) Inventors: Sung-Won Yun, Suwon-si (KR); Hye-Jin Yim, Wonju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/198,013

(22) Filed: Nov. 21, 2018

(65) Prior Publication Data

US 2019/0164618 A1  May 30, 2019

(30) Foreign Application Priority Data

Nov. 24, 2017 (KR) .................. 10-2017-0158571

(51) Int. Cl.
| G11C 16/34 | (2006.01) |
| G11C 16/10 | (2006.01) |
| G11C 16/08 | (2006.01) |
| G11C 16/04 | (2006.01) |
| G11C 11/56 | (2006.01) |

(Continued)

(52) U.S. Cl.
CPC ...... *G11C 16/3459* (2013.01); *G11C 11/5671* (2013.01); *G11C 16/0483* (2013.01); *G11C 16/08* (2013.01); *G11C 16/10* (2013.01); *G11C 16/14* (2013.01); *G11C 2211/5621* (2013.01); *G11C 2216/14* (2013.01); *H01L 27/11582* (2013.01)

(58) Field of Classification Search
CPC ..... G11C 16/3459; G11C 16/10; G11C 16/08; G11C 16/0483; G11C 16/14; G11C 11/5671; G11C 2216/14; G11C 2211/5621; H01L 27/11582
See application file for complete search history.

(56) References Cited

U.S. PATENT DOCUMENTS

| 7,224,615 B2 | 5/2007 | Tanaka |
| 7,800,956 B2 | 9/2010 | Lee et al. |
| 7,965,562 B2 | 6/2011 | Cernea |

(Continued)

*Primary Examiner* — Harry W Byrne
*Assistant Examiner* — Sultana Begum
(74) *Attorney, Agent, or Firm* — Volentine, Whitt & Francos, PLLC

(57) ABSTRACT

A nonvolatile memory device includes multiple memory cells including first memory cells and second memory cells. A method of programming the nonvolatile memory device includes: performing first programming to apply a programming forcing voltage to a bit line of each of the first memory cells; and dividing the second memory cells into a first cell group, a second cell group, and a third cell group, based on a threshold voltage of the second memory cells after performing the first programming. The method also includes performing second programming to apply a programming inhibition voltage to the bit line of each of the first memory cells and a bit line of each of memory cells of the first cell group. A level of the programming forcing voltage is lower than that of the programming inhibition voltage.

20 Claims, 12 Drawing Sheets

(51) Int. Cl.
 *G11C 16/14* (2006.01)
 *H01L 27/11582* (2017.01)

(56) References Cited

U.S. PATENT DOCUMENTS

| | | |
|---|---|---|
| 8,174,895 B2 | 5/2012 | Chen et al. |
| 8,472,245 B2 | 6/2013 | Kim |
| 9,007,840 B2 | 4/2015 | Park |
| 9,165,659 B1 | 10/2015 | Pang et al. |
| 2009/0296466 A1* | 12/2009 | Kim .................... G11C 11/5628 365/185.03 |
| 2016/0049200 A1* | 2/2016 | Park ................... G11C 16/3459 365/185.19 |
| 2017/0110185 A1* | 4/2017 | Hahn .................. G11C 11/5628 |
| 2019/0294362 A1* | 9/2019 | Lee ....................... G06F 3/0679 |

\* cited by examiner

NONVOLATILE MEMORY DEVICE AND METHOD OF PROGRAMMING WITH BIT LINE PROGRAMMING FORCING VOLTAGE AND PROGRAMMING INHIBITION VOLTAGE

CROSS-REFERENCE TO RELATED APPLICATION

This U.S. non-provisional patent application claims priority under 35 U.S.C. § 119 to Korean Patent Application No. 10-2017-0158571, filed on Nov. 24, 2017 in the Korean Intellectual Property Office, the disclosure of which is incorporated herein in its entirety by reference.

BACKGROUND

1. Field

The present disclosure relates to a method of programming a nonvolatile memory device.

2. Description of Related Art

A semiconductor memory device may include a volatile memory such as dynamic random-access memory (DRAM) and static random-access memory (SRAM), and a nonvolatile memory such as electrically erasable programmable read-only memory (EEPROM), ferroelectric RAM (FRAM), phase-change RAM (PRAM), resistive RAM (RRAM), magnetic RAM (MRAM), and flash memory. The volatile memory loses stored data when power supply is interrupted, while the nonvolatile memory retains stored data even when power supply is interrupted.

Examples of devices using a nonvolatile memory include an MP3 player, a digital camera, a mobile phone, a camcorder, a flash card, and a solid-state disk (SSD). As the number of devices using a nonvolatile memory as a storage device increases, the capacity of the nonvolatile memory is also rapidly increasing. A method of programming the nonvolatile memory may use a programming operation by an increment step pulse programming (ISPP) method, and may use a verifying operation to verify a programmed state of memory cells using a verifying voltage after a programming voltage pulse is provided to the memory cells in the programming operation. However, even after completing the verifying operation, the reliability of data stored in the memory cells in the programming operation deteriorates due to memory cell characteristics.

SUMMARY

The present disclosure provides a nonvolatile memory device which may improve a programming speed and reduce a width (range) of threshold voltage distribution of memory cells in a programmed state, and a method of programming the nonvolatile memory device.

According to an aspect of the present disclosure, a nonvolatile memory device includes multiple memory cells including first memory cells and second memory cells having a threshold voltage lower than that of the first memory cells. A method of programming the nonvolatile memory device includes: performing first programming to apply a programming forcing voltage to a bit line of each of the first memory cells; and dividing the second memory cells into a first cell group, a second cell group, and a third cell group, based on a threshold voltage of the second memory cells after performing the first programming. The method also includes performing second programming to apply a programming inhibition voltage to the bit line of each of the first memory cells and a bit line of each of memory cells of the first cell group. A level of the programming forcing voltage is lower than that of the programming inhibition voltage.

According to another aspect of the present disclosure, a nonvolatile memory device includes multiple memory cells that are divided into a first cell group, a second cell group, and a third cell group according to a level of a threshold voltage. A method of programming the nonvolatile memory device includes: applying a programming inhibition voltage to a bit line of each of memory cells of the first cell group; and applying a programming forcing voltage having a level lower than the programming inhibition voltage to a bit line of each of the memory cells of the second cell group. The method also includes performing first programming by applying a first programming pulse to a word line of the memory cells; and performing second programming by applying a programming inhibition voltage to bit lines of the memory cells of the first cell group and the second cell group and then applying a second programming pulse to the word line of the multiple memory cells.

According to another aspect of the present disclosure, a nonvolatile memory device includes: a cell array, a row decoder, and a page buffer. The cell array includes multiple memory cells including first memory cells and second memory cells. The row decoder is configured to provide a first programming pulse to a word line of multiple memory cells in a first programming loop and a second programming pulse to a word line of the multiple memory cells in a second programming loop. The page buffer is configured to provide a programming inhibition voltage and a programming forcing voltage having a level lower than a level of the programming inhibition voltage to bit lines of the multiple memory cells. A control logic unit is configured to control the row decoder and the page buffer such that the first programming loop and the second programming loop are sequentially performed. The programming forcing voltage is applied to a bit line of each of the first memory cells in the first programming loop, and the control logic unit is configured to control the page buffer such that the programming inhibition voltage is applied to the bit line of each of the first memory cells in the second programming loop.

BRIEF DESCRIPTION OF THE DRAWINGS

Example embodiments of the present disclosure will be more clearly understood from the following detailed description taken in conjunction with the accompanying drawings in which.

DETAILED DESCRIPTION OF THE EMBODIMENTS

Figure 1:
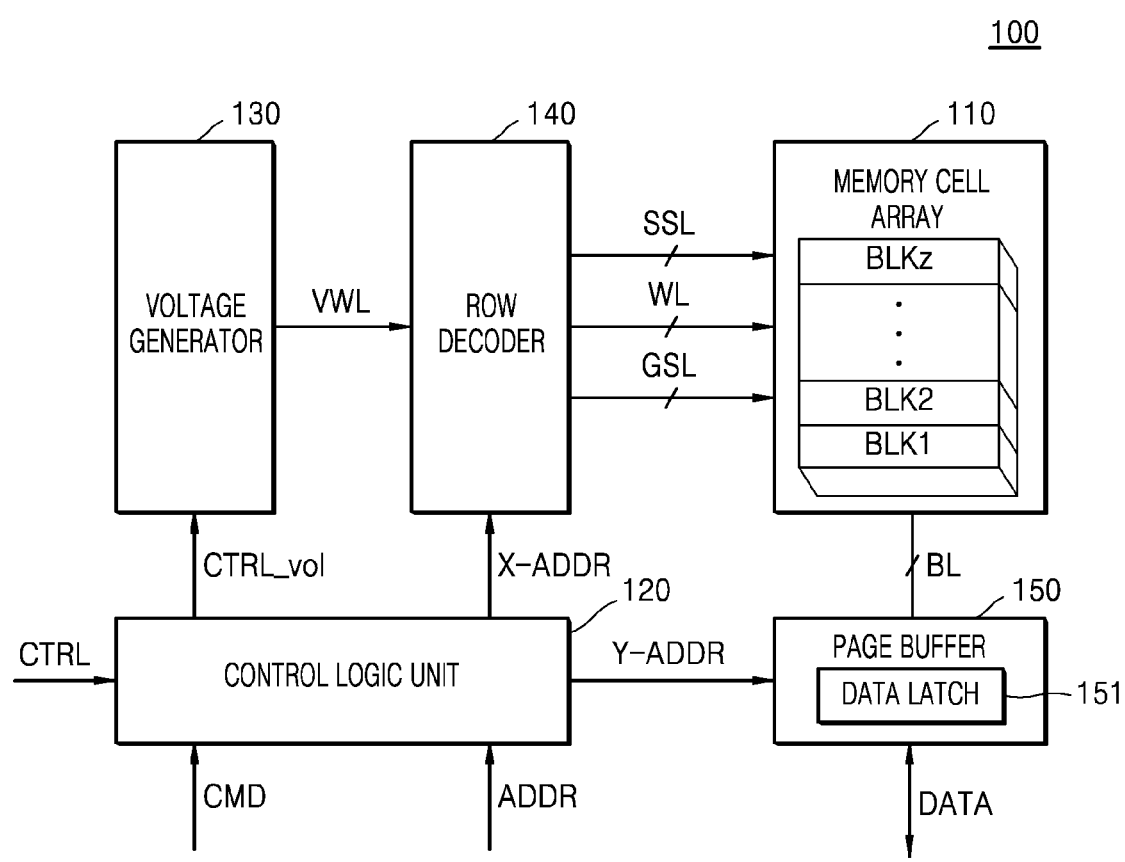
FIG. 1 is a block diagram illustrating a nonvolatile memory device according to an embodiment of the present disclosure.

FIG. 1 is a block diagram illustrating a nonvolatile memory device 100 according to an embodiment of the present disclosure.

Referring to FIG. 1, the nonvolatile memory device 100 may include a memory cell array 110, a control logic unit 120, a voltage generator 130, a row decoder 140, and a page buffer 150. Although not shown, the nonvolatile memory device 100 may further include a data input/output circuit or an input/output interface.

The memory cell array 110 includes a plurality of memory cells and may be connected to word lines WL, string selection lines SSL, ground selection lines GSL, and a plurality of bit lines BL. In more detail, the memory cell array 110 may be connected to the row decoder 140 through the word lines WL, the string selection lines SSL, and the ground selection lines GSL, and may be connected to the page buffer 150 through the plurality of bit lines BL.

The memory cell array 110 may include a plurality of blocks BLK1 to BLKz. For example, each of the plurality of blocks BLK1 to BLKz may have a three-dimensional (3D) structure (or a vertical structure). In more detail, each of the blocks BLK1 to BLKz includes structures extending in a first direct, a second direction and a third direction. The first direction and the second direction may intersect at 90 degrees to be perpendicular. The third direction may be perpendicular to a plane formed by the first direction and the second direction, so as to intersect each of the first direction and the second direction at 90 degrees. For example, each of the blocks includes a plurality of NAND strings (hereinafter referred to as "strings") extending in the third direction. Here, the plurality of strings may be provided spaced apart from each other by a certain distance in the first and second directions. The blocks BLK1 to BLKz may be selected by the row decoder 140. For example, the row decoder 140 may select a block corresponding to a block address from among the blocks BLK1 to BLKz.

Each memory cell included in the memory cell array 110 may be a multi-level cell (MLC) storing two or more bits of data. For example, a memory cell may be an MLC storing 2-bit data. As another example, a memory cell may be a triple level cell (TLC) for storing 3-bit data, or quad level cell (QLC) for storing 4-bit data. However, the present disclosure is not limited thereto. In another embodiment, some memory cells included in the memory cell array 110 may be a single-level cell (SLC) for storing 1-bit data, and the other memory cells may be an MLC.

A plurality of memory blocks BLK1 to BLKi among the blocks BLK1 to BLKz may include at least one of an SLC block including a single-level cell, an MLC block including multi-level cells, and a TLC block including triple-level cells. Some of the plurality of memory blocks included in the memory cell array 110 may be SLC blocks, and other blocks may be MLC blocks or TLC blocks.

When an erasing voltage is applied to the memory cell array 110, the plurality of memory cells are erased. When a programming pulse is applied to the memory cell array 110, the plurality of memory cells are programmed. Each of the memory cells may have an erased state E and at least one programmed state, which are classified according to a threshold voltage Vth.

For example, in the erased state, the memory cells may be programmed based on a preset programming pulse corresponding to the programmed state and then divided into three cell groups based on threshold voltage distribution in a Gaussian form of the memory cells. A first cell group may correspond to an uppermost region of the threshold voltage distribution. Thereafter, from among the three cell groups, the second cell group and the third cell group may be reprogrammed. The first programming pulse may be preset according to distribution of pre-programmed memory cells or the like. In one embodiment, distribution of the first cell group may be included in a target distribution of the programmed state. This will be described below with reference to FIG. 5A.

In another embodiment, in the erased state, the memory cells may be programmed based on the preset programming pulse in response to the programmed state and then reprogrammed based on the first programming pulse so that a width of the threshold voltage distribution of the memory cells may be reduced. Thereafter, the memory cells may be divided into three cell groups. This will be described below with reference to FIG. 9.

The control logic unit 120 may be implemented as circuitry, such as with memory elements, comparators and other forms of circuit elements. The control logic unit 120 may also be implemented as a combination of a processor and software executed by the processor, or by a combination of both circuitry and a processor that executes software and the software executed by the processor. Based on a command CMD, an address ADDR, and a control signal CTRL received from a memory controller 200, the control logic unit 120 may output various control signals to write/read data to/from the memory cell array 110. Thus, the control logic unit 120 may control various operations in the nonvolatile memory device 100 as a whole. In one embodiment, when a plurality of memory cells are programmed, a plurality of programming loops may be performed sequentially, and the control logic unit 120 may control various operations in the nonvolatile memory device 100 such that the plurality of programming loops are performed.

Various control signals output from the control logic unit 120 may be provided to the voltage generator 130, the row decoder 140, and the page buffer 150. The control logic unit 120 may provide a voltage control signal CTRL_vol to the voltage generator 130. In one embodiment of the present disclosure, the control logic unit 120 may generate a programming pulse provided to the memory cell array 110 to write data to the memory cells and the voltage control signal CTRL_vol for controlling generation of a verifying voltage.

The control logic unit 120 may control the voltage generator 130 such that the voltage generator 130 generates at least one verifying voltage and at least one programming pulse in each programming loop, and further generates a programming pulse with a level that changes as the number of the programming loops increases.

Based on the voltage control signal CTRL_vol, the voltage generator 130 may generate various voltages to perform programming, reading, and erasing operations on the memory cell array 110. The voltage generator 130 may generate a word-line voltage VWL, for example, a programming pulse and a verifying voltage. In one embodiment, based on the voltage control signal CTRL_vol, the voltage generator 130 may generate a programming pulse and a verifying voltage with levels that change as the number of programming loops increases. When a programming loop is performed, a programming method according to an embodiment may be performed by an ISPP method. The voltage generator 130 may generate a programming pulse with a level higher than that of a previous programming pulse every time the programming loop is performed. In other words, the level of the programming pulse may incrementally increase each time the programming loop is performed. However, the present disclosure is not limited thereto, the programming pulse of each the programming loop may have same level, or the programming pulse of each the programming loop may have different pulse duration.

The row decoder 140 may select some of the word lines WL in response to a row address X-ADDR received from the control logic unit 120. In more detail, during the programming operation, the row decoder 140 may provide a programming pulse to the selected word lines. Also, the row decoder 140 may select some of the string selection lines SSL or some of the ground selection lines GSL in response to a row address X-ADDR received from the control logic unit 120. The row decoder 140 may receive at least one verifying voltage and at least one programming pulse for each programming loop from the voltage generator 130 to provide the at least one verifying voltage and the at least one programming pulse to a word line of the plurality of memory cells.

The page buffer 150 may be connected to the memory cell array 110 through the bit lines BL, and may select some of the bit lines BL in response to a column address Y-ADDR received from the control logic unit 120. During the read operation, the page buffer 150 may sense data DATA stored in the memory cell array 110 by being operated as a sense amplifier. Meanwhile, during the programming operation, the page buffer 150 may input the data DATA to be stored in the memory cell array 110 by being operated as a write driver.

The page buffer 150 may store the data DATA read from the memory cell array 110 or may store data DATA to be written to the memory cell array 110. The page buffer 150 may include a plurality of data latches 151, and the plurality of data latches 151 may temporarily store the data DATA. In one embodiment, the plurality of data latches 151 may temporarily store information about a memory cell which is applied with a forcing voltage to a bit line in a previous programming loop.

When the row decoder 140 applies a programming pulse to a selected word line during the programming operation, the page buffer 150 may apply a bit line voltage such as a programming inhibition voltage, a programming forcing voltage, and a bit line programming voltage to the plurality of bit lines BL according to a speed at which the memory cell is programmed. A programming inhibition voltage is a voltage that, when applied to a bit line, inhibits programming of memory cells connected to the bit line, such as to prevent the memory cells connected to the bit line from being over programmed. A programming forcing voltage is a voltage that, when applied to a bit line, may be a voltage that results in relatively weak programming of memory cells and which is of a voltage level lower than the programming inhibition voltage. A bit line programming voltage may be a ground voltage, for example, and may be a voltage that also results in programming of memory cells but which is of a voltage level lower than the programming forcing voltage.

In the nonvolatile memory device 100 according to the present disclosure, a plurality of memory cells may be divided into three cell groups based on threshold voltage distribution of the plurality of memory cells. In a first programming loop, the page buffer 150 may apply the programming inhibition voltage to the first cell group corresponding to an uppermost region of distribution of the memory cells. In the first programming loop, the page buffer 150 may apply the programming forcing voltage to the second cell group corresponding to a middle region of distribution of the memory cells. In the first programming loop, the page buffer 150 may apply the bit line programming voltage to the third cell group corresponding to a lowermost region of distribution of the memory cells.

Regardless of threshold voltage distribution of memory cells of the second cell group, in a second programming loop performed after the first programming loop, the memory cells of the second cell group may be prevented from over-programming by applying a programming inhibition voltage to a bit line of each of the memory cells of the second cell group. In this way, the programming inhibition voltage inhibits over-programming, such as in a second programming loop or a later programming loop. The programming inhibition voltage may be higher than the programming forcing voltage, which in turn is higher than a bit line programming voltage, as explained below with respect to FIG. 5C.

Accordingly, as explained above, in a first programming loop, the first cell group can be applied with the program inhibition voltage. In the second programming loop, the second cell group can be applied with the program inhibition voltage.

Figure 2:
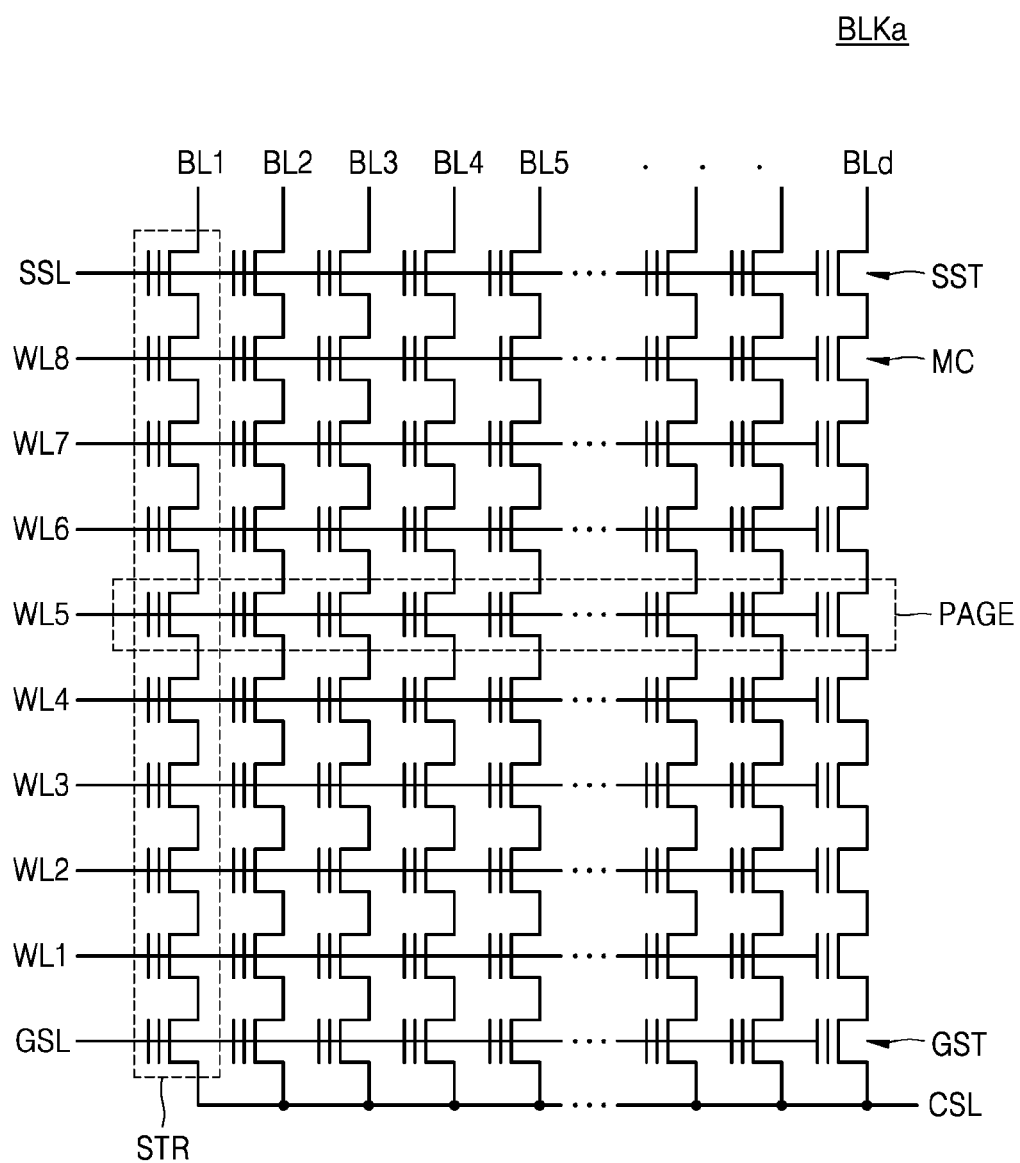
FIG. 2 is a circuit diagram illustrating an example of a memory block according to an embodiment of the present disclosure.

FIG. 2 is a circuit diagram illustrating an example of a memory block according to an embodiment of the present disclosure.

Referring to FIG. 2, a memory block BLKa may be horizontal NAND flash memory. The memory block BLKa may include d (d is an integer of 2 or more) strings STR in which a plurality of memory cells are connected in series. Each string STR may include a string selection transistor SST and a ground selection transistor GST, which are connected to both ends of the serially-connected memory cells MC, respectively. The number of strings STR, the number of word lines WL, and the number of bit lines BL may vary according to an embodiment.

A NAND flash memory device including a memory block having the structure as shown in FIG. 2 is erased in units of memory blocks and may perform a program in units of pages PAGE corresponding to each of word lines WL1 to WL8. In one example, when the memory cell MC is an SLC, one page PAGE may correspond to each word line. In another example, when the memory cell MC is an MLC, a TLC or a QLC, a plurality of pages PAGE may correspond to each word line.

Figure 3:
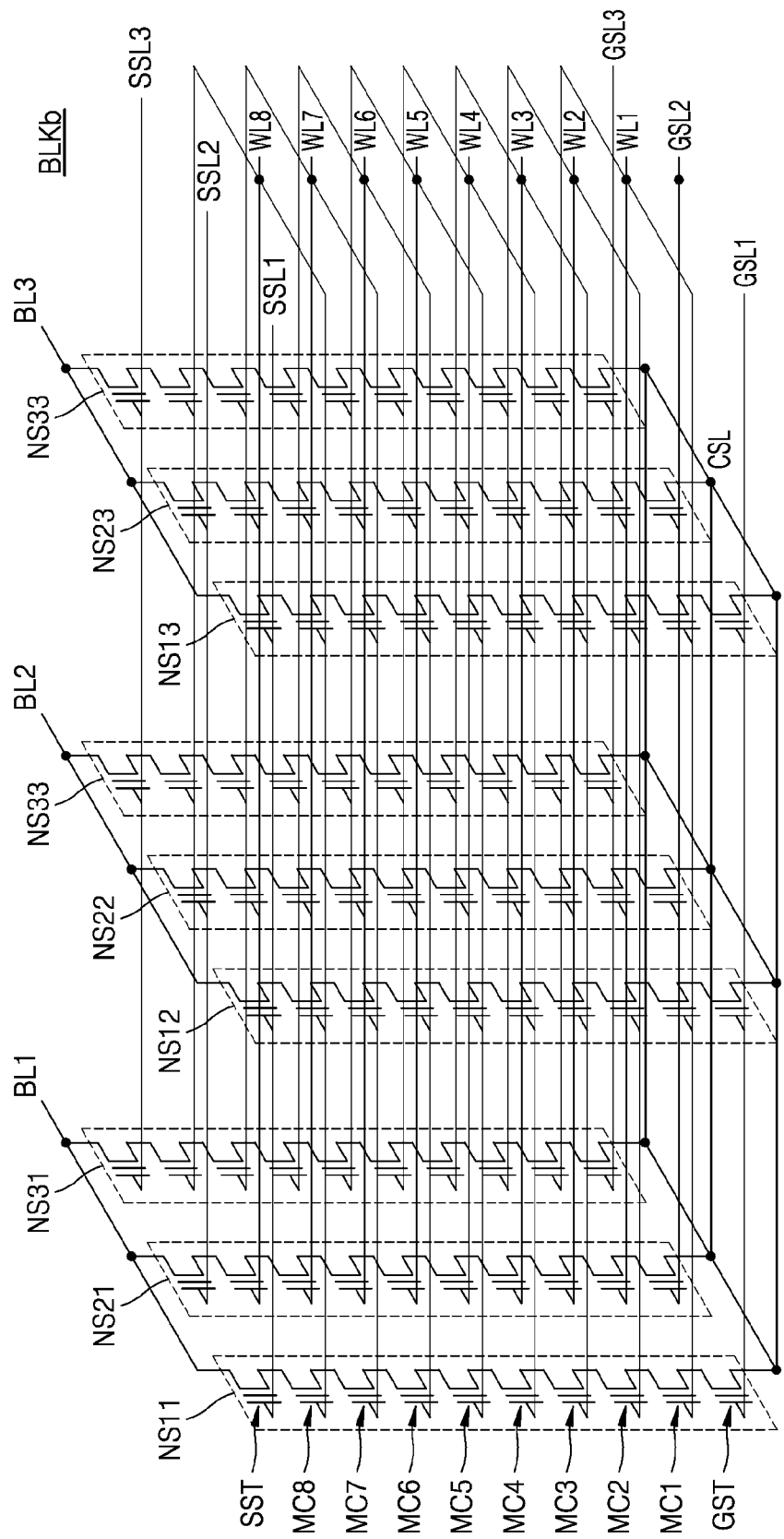
FIG. 3 is a circuit diagram illustrating another example of a memory block according to an embodiment of the present disclosure.

FIG. 3 is a circuit diagram illustrating another example of a memory block BLKb according to an embodiment of the present disclosure.

Referring to FIG. 3, the memory block BLKb may be a vertical NAND flash memory. The memory block BLKb may include a plurality of NAND strings NS11 to NS33, a plurality of word lines WL1 to WL8, a plurality of bit lines BL1 to BL3, ground selection lines GSL1, GSL2, and GSL3, a plurality of string selection lines SSL1 to SSL3, and a common source line CSL. Here, the number of NAND strings, the number of word lines, the number of bit lines, the number of ground selection lines, and the number of string selection lines may be variously changed according to an example embodiment.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. The NAND string (e.g., NS11) may include the string selection transistor SST, a plurality of memory cells MC1 through MC8, and the ground selection transistor GST that are connected in series. Hereinafter, for convenience of description, the NAND string will be referred to as a string.

Strings commonly connected to one bit line form one column. For example, the strings NS11, NS21 and NS31 commonly connected to the first bit line BL1 may correspond to a first column, the strings NS12, NS22 and NS32 commonly connected to the second bit line BL2 may correspond to a second column, and the strings NS13, NS23, and NS33 commonly connected to the third bit line BL3 may correspond to a third column.

Strings connected to one string selection line form one row. For example, the strings NS11, NS12, and NS13 connected to the first string selection line SSL1 may correspond to a first row, the strings NS21, NS22, and NS23 connected to the second string selection line SSL2 may correspond to a second row, and the strings NS31, NS32, and NS33 connected to the third string selection line SSL3 may correspond to a third row.

The string selecting transistor SST is connected to the string selection lines SSL1 to SSL3. The plurality of memory cells MC1 to MC8 are connected to the corresponding word lines WL1 to WL8, respectively. The ground selection transistor GST is connected to the ground selection lines GSL1, GSL2, and GSL3. The string selecting transistor SST is connected to a corresponding bit line BL, and the ground selection transistor GST is connected to the common source line CSL.

Figure 4:
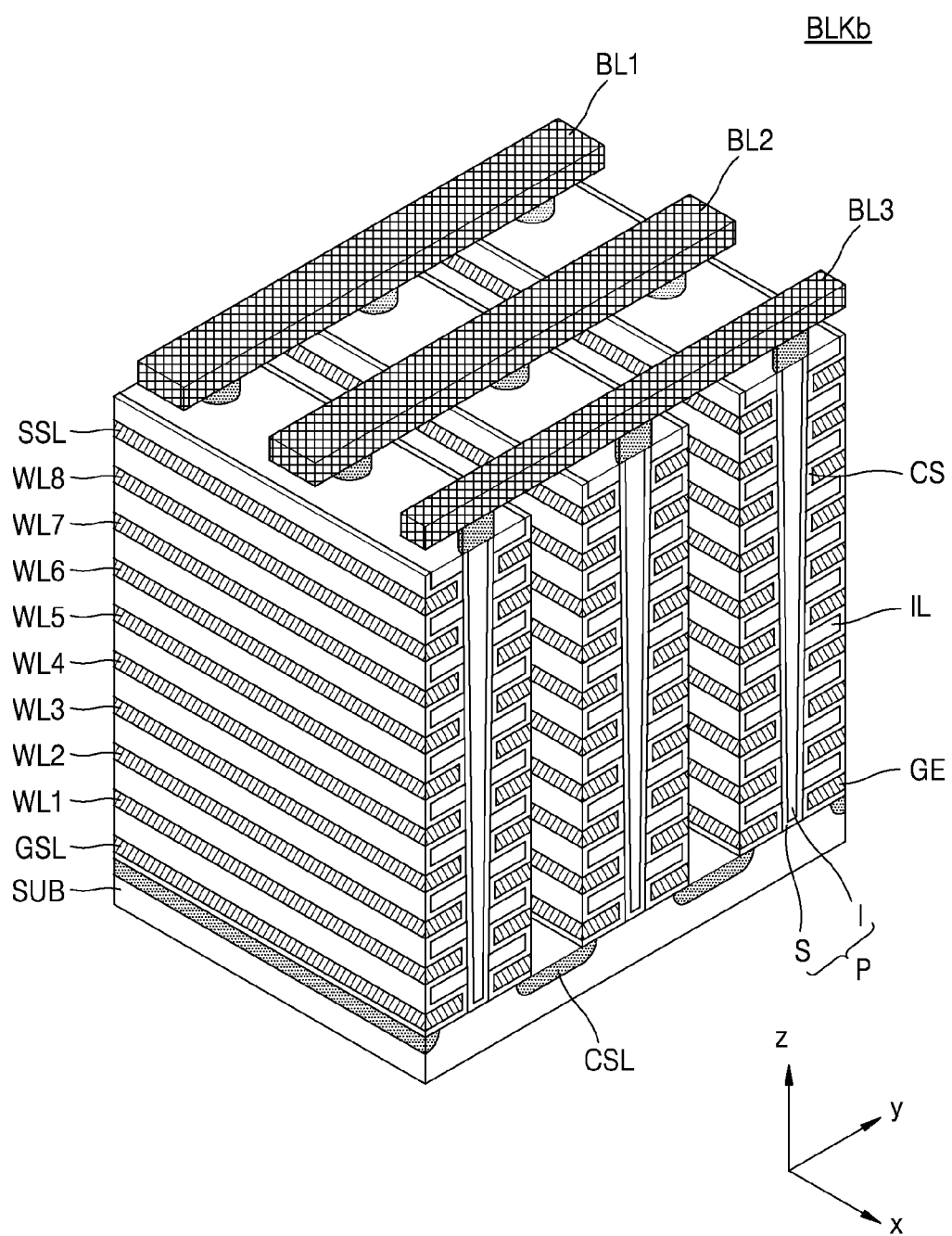
FIG. 4 is a perspective view illustrating the memory block according to the circuit diagram illustrating FIG. 3.

Word lines (e.g., WL1) having the same height are commonly connected to each other. The string selecting lines SSL1 to SSL3 are separated from each other. For example, when memory cells connected to a first word line WL1 and belonging to the strings NS11, NS12, and NS13 are programmed, the first word line WL1 and the first string selection line SSL1 may be selected. In one embodiment, as shown in FIG. 4, the ground selection lines GSL1, GSL2, and GSL3 may be separated from each other. In another embodiment, the ground selection lines GSL1, GSL2, and GSL3 may be connected to each other.

FIG. 4 is a perspective view illustrating the memory block BLKb according to the circuit diagram of FIG. 3.

Referring to FIG. 4, the memory block BLKb is formed in a direction perpendicular to a substrate SUB. The substrate SUB has a first conductivity type (e.g., a p-type) and extends in a first direction (e.g., an X-direction), and the common source line CSL doped with impurities of a second conductivity type (e.g., an n-type) may be provided. The common source line CSL may function as a source region for supplying current to vertical memory cells.

A plurality of insulating layers IL extending in a second direction (e.g., a Y-direction) are sequentially provided in a third direction (e.g., a Z-direction) on a region of the substrate SUB between two adjacent common source lines CSL, and the plurality of insulating layers IL are spaced apart from each other by a certain distance in the third direction. For example, the plurality of insulating layers IL may include an insulating material such as a silicon oxide.

A channel hole may be arranged sequentially in the first direction on the region of the substrate SUB between two adjacent common source lines CSL, and may be formed through the plurality of insulating layers IL in the third direction. The channel hole may have a cup shape (or a cylinder shape with a bottom) extending in a vertical direction. The channel hole may also be formed in a pillar shape as shown in drawings. Hereinafter, the channel hole will be referred to as pillars. A plurality of pillars P may be in contact with the substrate SUB through the plurality of insulating layers IL. In more detail, a surface layer S of each pillar P may include a first type of silicon material and may function as a channel region. An inner layer I of each pillar P may include an insulating material such as a silicon oxide or an air gap.

In the region between two adjacent common source lines CSL, a charge storage layer CS is provided along exposed surfaces of the insulating layers IL, the pillars P, and the substrate SUB. For example, the charge storage layer CS may have an oxide-nitride-oxide (ONO) structure. In addition, in the region between the two adjacent common source lines CSL, a gate electrode GE may be provided on an exposed surface of the charge storage layer CS.

Drains or drain contacts DR are provided on the plurality of pillars P, respectively. For example, the drains or drain contacts DR may include a silicon material doped with impurities of a second conductivity type. The bit lines BL extending in the second direction (e.g., the Y-direction) and spaced apart from each other by a certain distance in the first direction may be provided on the drains or drain contacts DR.

An embodiment of the memory block BLKb has been described with reference to FIG. 4. However, the present disclosure is not limited thereto and a structure of the memory block BLKb may vary.

Figure 5A:
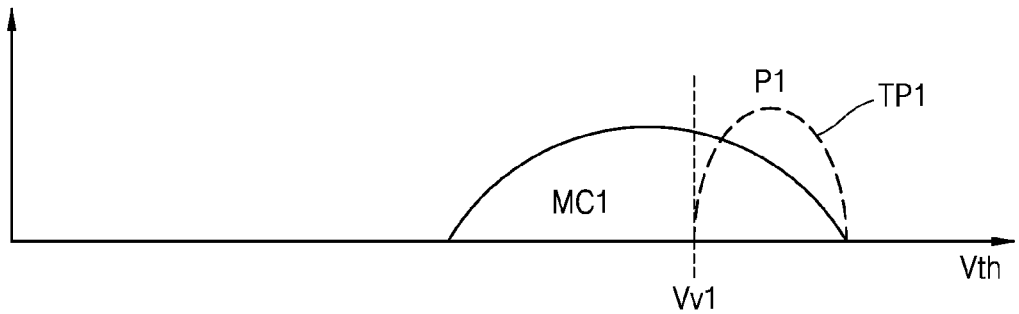
FIG. 5A is a graph illustrating operations of a programming method of a nonvolatile memory device according to an embodiment of the present disclosure.
Figure 5A:
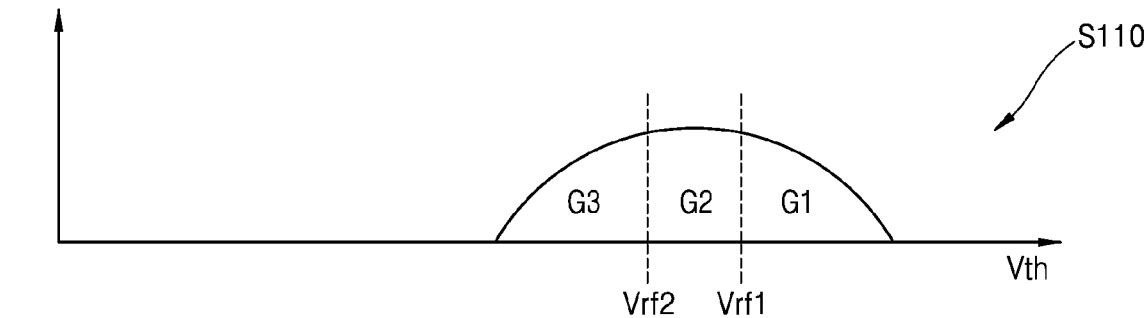
Figure 5A:
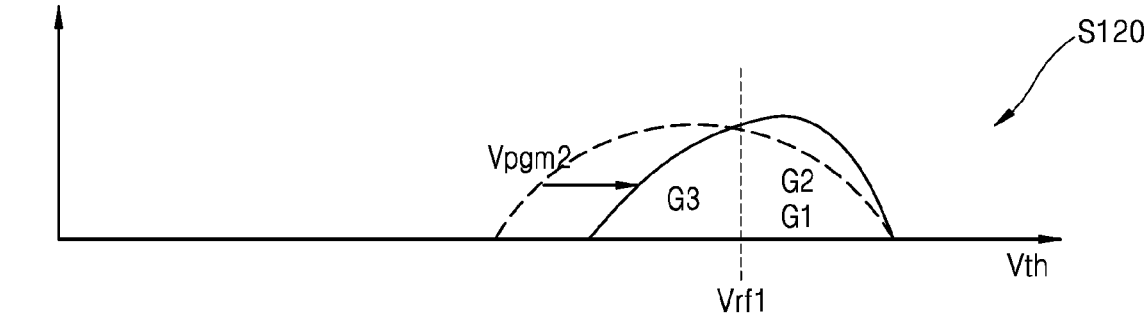
Figure 5A:
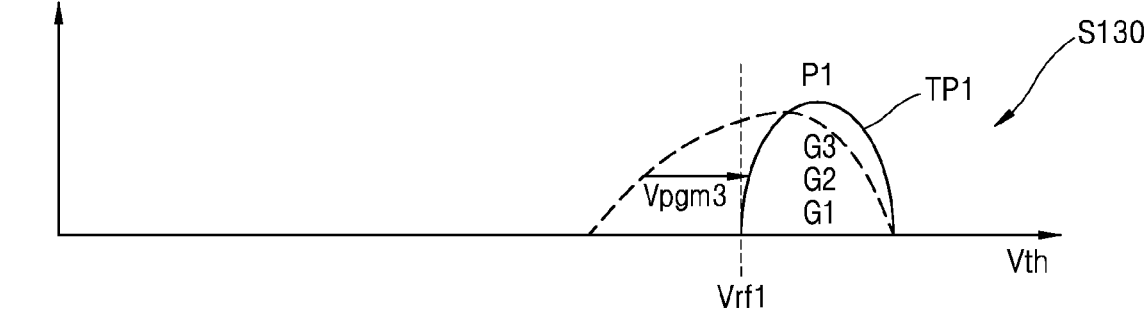
Figure 5B:
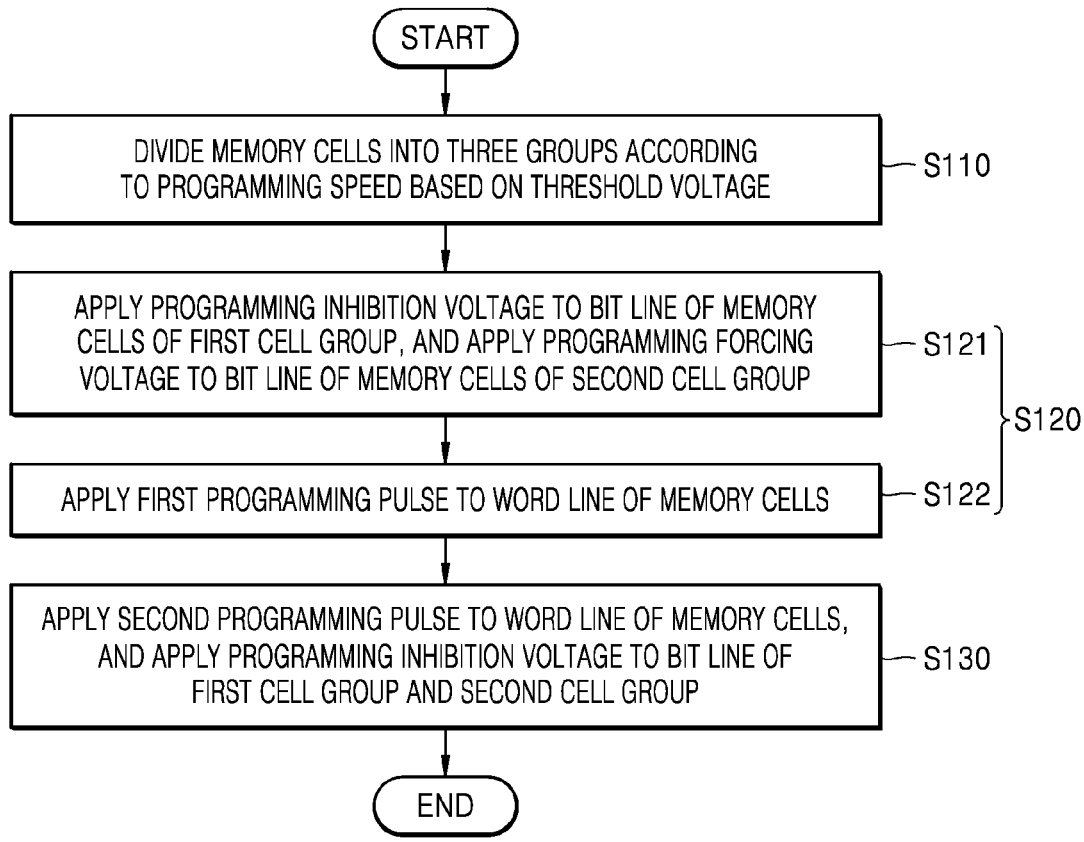
FIG. 5B is a flowchart illustrating a programming method of a nonvolatile memory device according to an embodiment of the present disclosure.
Figure 5C:
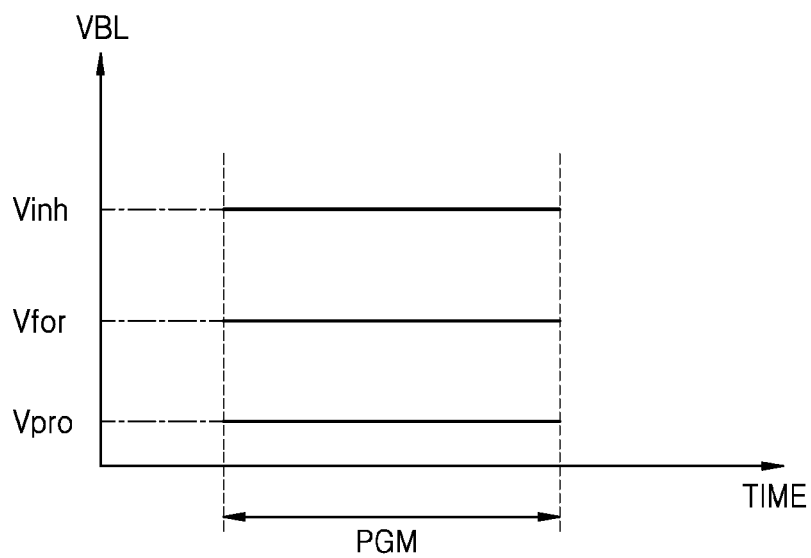
FIG. 5C is a graph illustrating bit line voltages applied to multiple memory cells included in a nonvolatile memory device, according to an embodiment of the present disclosure.

FIG. 5A is a graph illustrating operations of a programming method of a nonvolatile memory device according to an embodiment of the present disclosure. FIG. 5B is a flowchart illustrating a programming method of a nonvolatile memory device according to an embodiment of the present disclosure. FIG. 5C is a graph illustrating bit line voltages applied to multiple memory cells included in a nonvolatile memory device, according to an embodiment of the present disclosure.

Referring to FIGS. 5A and 5B, in operation S110, the plurality of memory cells MC1 to be programmed in a first programmed state P1 may be divided into three groups based on a threshold voltage. The plurality of memory cells MC1 may be divided into three cell groups through a read verification operation. In one embodiment, a control logic unit (e.g., 120 of FIG. 1) may divide the plurality of memory cells MC1 into a first cell group G1, a second cell group G2, and a third cell group G3 by verifying the memory cells based on a first verifying voltage Vrf1 and a second verifying voltage Vrf2. The dividing operation will be described in detail with reference to FIGS. 6A and 6B.

The first cell group G1, the second cell group G2, and the third cell group G3 may be divided based on threshold voltage distribution. The first cell group G1 may correspond to an uppermost region of threshold voltage distribution, and the third cell group G3 may correspond to a lowermost region of the threshold voltage distribution.

In one embodiment, the first verifying voltage Vrf1 may be the same as a verification read voltage Vv1 for the first programmed state P1 for verifying whether the plurality of memory cells MC1 are normally programmed in the first programmed state P1.

Referring to FIGS. 5A to 5C, in operation S121, a programming inhibition voltage Vinh may be applied to a bit line of memory cells of the first cell group G1, a programming forcing voltage Vfor may be applied to a bit line of each of memory cells of the second cell group G2. A bit line programming voltage Vpro may be applied to a bit line of each of memory cells of the third cell group G3. A level of the programming inhibition voltage Vinh may be higher than that of the programming forcing voltage Vfor and a level of the programming forcing voltage Vfor may be higher than that of the bit line programming voltage Vpro. In one embodiment, the bit line programming voltage Vpro may be provided at a ground level or 0 V, the program inhibit voltage Vinh may be provided at a power supply voltage, and the programming forcing voltage Vfor may be provided as a value between the ground level and the power supply voltage.

In operation S122, the first programming pulse Vpgm1 may be applied to the word line of the plurality of memory cells MC1. Threshold voltage distribution of the plurality of memory cells MC1 may be changed after the application of the first programming pulse Vpgm1 to the word line of the plurality of memory cells MC1. The memory cells of the first cell group G1, to which the programming inhibition voltage Vinh is applied, may not be programmed and the memory cells of the second cell group G2 and the third cell group G3 may be programmed. Therefore, threshold voltage distribution of the second cell group G2 and the third cell group G3 may move to the right. Since the programming forcing voltage Vfor having a level higher than that of the bit line programming voltage Vpro is applied to the memory cells of the second cell group G2, the memory cells of the second cell group G2 may have a relatively small degree of movement of threshold voltage distribution compared to movement of the memory cells of the third cell group G3. In one embodiment, the second cell group G2 may be included in target distribution TP1 as the first programming pulse Vpgm1 is applied to the second cell group G2. However, the present disclosure is not limited thereto, and some of the memory cells of the second cell group G2 may not be included in the target distribution TP1 and may have a threshold voltage lower than the first verifying voltage Vrf1.

In operation S130, a second programming pulse Vpgm2 may be applied to the word line of the plurality of memory cells MC1. The programming inhibition voltage Vinh may be applied to the bit line of the first cell group G1 and the second cell group G2. Information about the first cell group G1 and the second cell group G2 may be stored in a data latch (e.g., 151 of FIG. 1) of the page buffer (e.g., 150 of FIG. 1). In operation S130, the control logic unit (e.g., 120 of FIG. 1) may control the page buffer 150 to apply the programming inhibition voltage Vinh to a bit line without separately verifying the memory cells of the first cell group G1 and the second cell group G2. The first programming pulse Vpgm1 and the second programming pulse Vpgm2 will be described in detail with reference to FIGS. 7A and 7B, and operation S130 will be described in detail with reference to FIGS. 6A and 6B.

A voltage level of the second programming pulse Vpgm2 may be higher than that of the first programming pulse Vpgm1. However, the present disclosure is not limited thereto, the first programming pulse Vpgm1 and the second programming pulse Vpgm2 may have same level, or the first programming pulse Vpgm1 and the second programming pulse Vpgm2 may have different pulse duration. Therefore, the threshold voltage distribution of the third cell group G3 moves to the right and the third cell group G3 may be included in the target distribution TP1. Thus, the plurality of memory cells MC1 may be programmed in the first programmed state P1. However, the present disclosure is not limited thereto. Even after the second programming pulse Vpgm2 is applied to the plurality of memory cells MC1, some of the plurality of memory cells MC1 may not be programmed in the first programmed state P1. This will be described below with reference to FIG. 6A and the like.

According to an embodiment of the present disclosure, when the programming forcing voltage was applied to the bit line of the memory cells of the second cell group G2 when applying a first programming pulse in the previous operation, the nonvolatile memory device may apply a programming inhibition voltage to the same bit line so that the memory cells of the second cell group G2 are not to be programmed by a second programming pulse. Thus, the nonvolatile memory device may prevent the memory cells of the second cell group G2 from being over-programmed as the second programming pulse is applied, thereby reducing a width of threshold voltage distribution of a plurality of memory cells and improving accuracy of the programming operation.

Figure 6A:
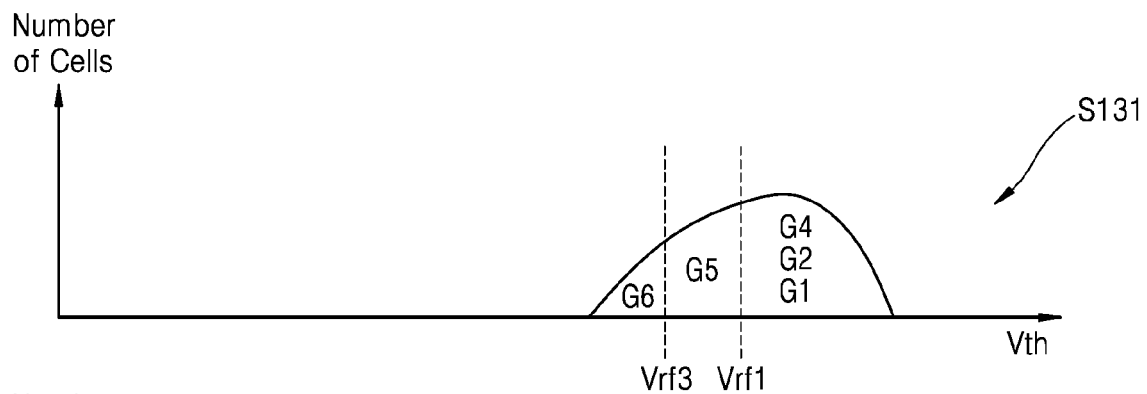
FIG. 6A is a graph illustrating operations of a programming method of a nonvolatile memory device according to an embodiment of the present disclosure and explains operation S130 of FIG. 5A.
Figure 6A:
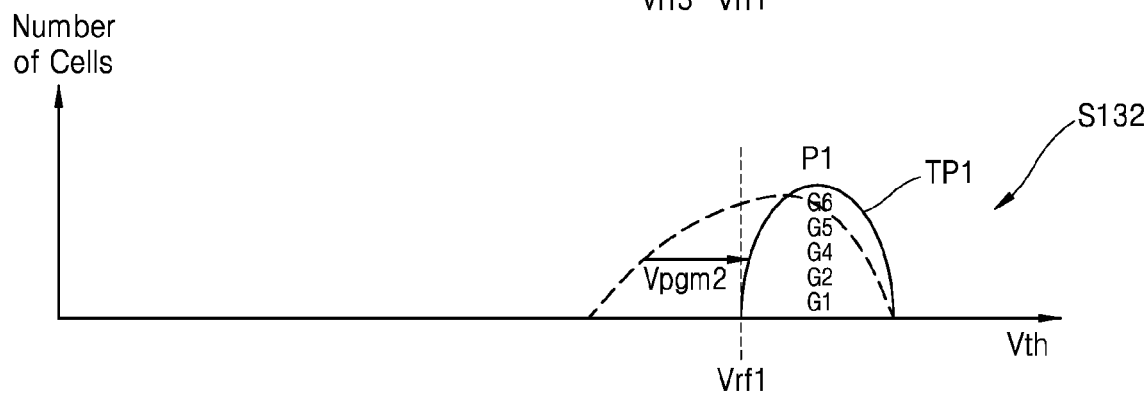
Figure 6B:
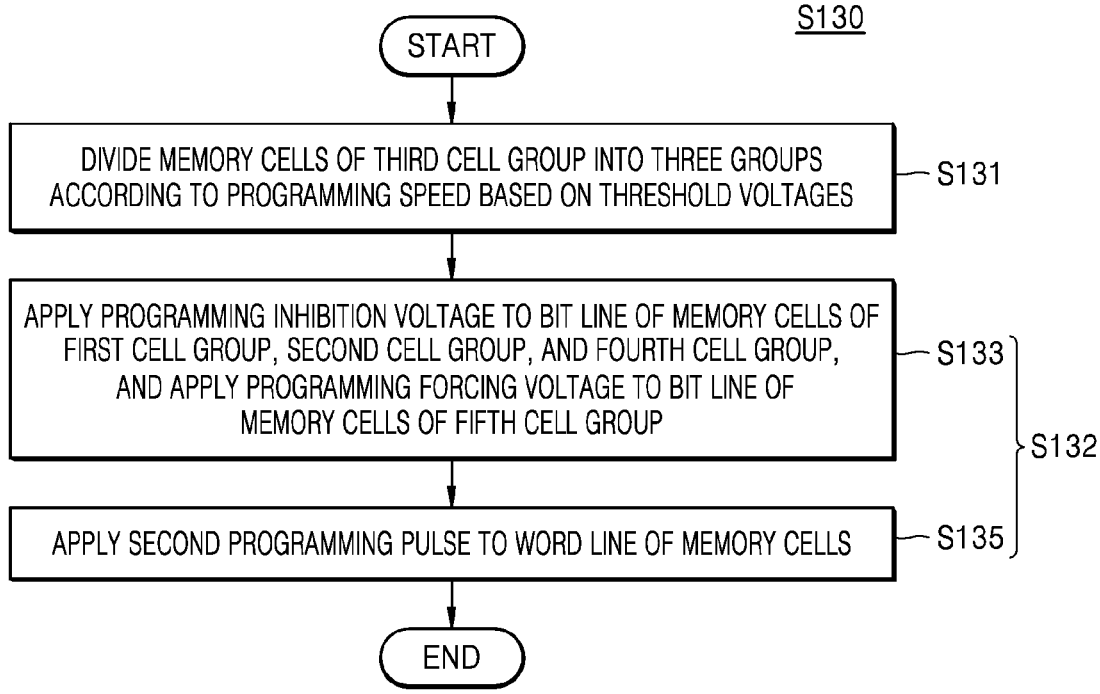
FIG. 6B is a flowchart illustrating a programming method of a nonvolatile memory device according to an embodiment of the present disclosure and explains operation S130 of FIG. 5B.

FIG. 6A is a graph explaining operation S130 of FIG. 5A of a stepwise programming method of a nonvolatile memory device according to an embodiment of the present disclosure. FIG. 6B is a flowchart illustrating a programming method of a nonvolatile memory device according to an embodiment of the present disclosure and explains operation S130 of FIG. 5B.

Referring to FIGS. 5A, 6A and 6B, in operation S131, after the first programming pulse Vpgm1 is applied to the word line of the plurality of memory cells MC1, the memory cells of the third cell group G3 may be divided into three groups on threshold voltages of the memory cells of the third cell group G3. In one embodiment, a control logic unit (e.g., 120 of FIG. 1) may divide the memory cells of the third cell group G3 into a fourth cell group G4, a fifth cell group G5, and a sixth cell group G6 by verifying the memory cells based on the first verifying voltage Vrf1 and a third verifying voltage Vrf3.

In one embodiment, a level of the third verifying voltage Vrf3 may be equal to that of the second verifying voltage Vrf2 of FIG. 5A, but the present disclosure is not limited thereto. A level of the third verifying voltage Vrf3 may be different from that of the second verifying voltage Vrf2 of FIG. 5A.

In operation S133, a programming inhibition voltage may be applied to a bit line of the memory cells of the first cell group G1, the second cell group G2, and the fourth cell group G4, and a programming forcing voltage may be applied to a bit line of memory cells of the fifth cell group G5. A bit line programming voltage may be applied to a bit line of memory cells of the sixth cell group G6.

In operation S135, the second programming pulse Vpgm2 may be applied to the word line of the plurality of memory cells MC1, so that the threshold voltage distribution of the plurality of memory cells MC1 may be changed. The memory cells of the first cell group G1, the second cell group G2, and the fourth cell group G4, to which a programming inhibition voltage Vinh applied, may not be programmed and the memory cells of the fifth cell group G5 and the sixth cell group G6 may be programmed. Therefore, threshold voltage distribution of the fifth cell group G5 and the sixth cell group G6 may move to the right. Since a programming forcing voltage having a level higher than that of a bit line programming voltage is applied to the memory cells of the fifth cell group G5, the memory cells of the fifth cell group G5 may have a relatively small degree of movement of threshold voltage distribution compared to that of the memory cells of the sixth cell group G6. Thus, the plurality of memory cells MC1 may be programmed in the first programmed state P1.

Figure 7A:
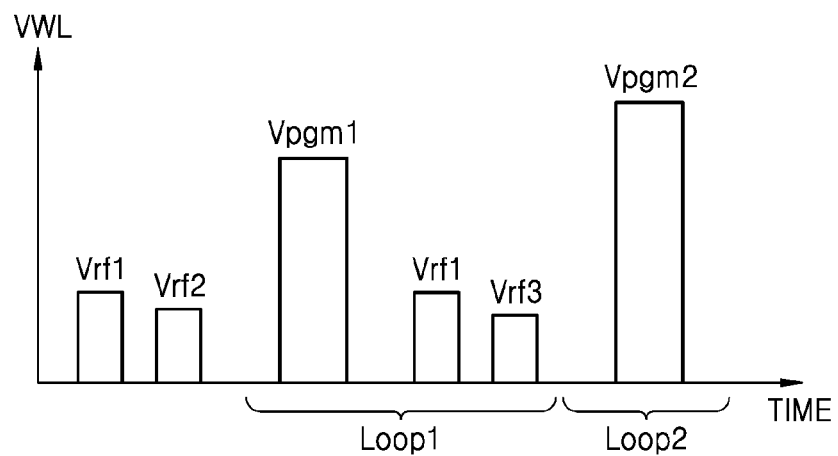
FIGS. 7A and 7B are graphs illustrating voltages supplied to a word line according to a programming method according to an embodiment of the present disclosure.
Figure 7B:
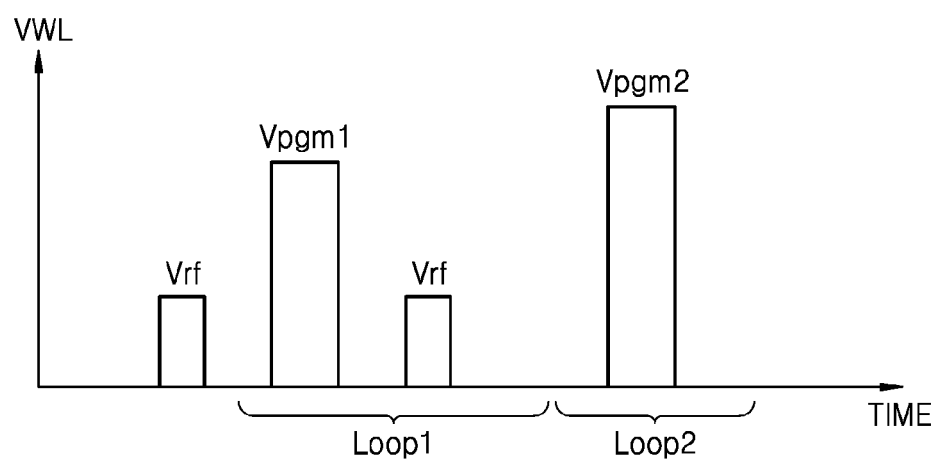

FIGS. 7A and 7B are graphs illustrating voltages supplied to a word line according to a programming method according to an embodiment of the present disclosure, and are graphs for explaining operations of dividing the plurality of memory cells of FIGS. 5A and 5B into a plurality of cell groups. Here, the horizontal axis represents time t and the vertical axis represents a level of the word line voltage VWL.

Referring to FIG. 7A, a method of programming a nonvolatile memory device in a first programmed state may include a plurality of programming loops Loop1 and Loop2. For example, the first programming loop Loop1 and the second programming loop Loop2 may be sequentially executed. At least one programming loop may be executed before the first programming loop Loop1, and at least one programming loop may be executed after the second programming loop Loop2, but the present invention is not limited thereto.

As the first verifying voltage Vrf1 and the second verifying voltage Vrf2 are applied to a word line of plurality of memory cells before the first programming loop Loop1 is executed, a first verifying operation may be performed. A level of the first verifying voltage Vrf1 may be the same as that of a verification read voltage for the first programmed state and a level of the second verifying voltage Vrf2 may be lower than that of the first verifying voltage Vrf1. In FIG. 7A, the second verifying voltage Vrf2 is applied after the first verifying voltage Vrf1 is applied. However, the present disclosure is not limited thereto, the second verifying voltage Vrf2 may be applied before the verifying voltage Vrf1 may be applied.

By comparing a threshold voltage of each of the plurality of memory cells with the first verifying voltage Vrf1 and the second verifying voltage Vrf2, a memory cell having a threshold voltage higher than that of the first verifying voltage Vrf1 may be detected as the first cell group, and a memory cell having a threshold voltage lower than that of the second verifying voltage Vrf2 may be detected as the third cell group. A memory cell having a threshold voltage between the first verifying voltage Vrf1 and the second verifying voltage Vrf2 may be detected as the second cell group.

Thus, operation S110 of FIG. 5B may be performed by applying the first verifying voltage Vrf1 and the second verifying voltage Vrf2 to the word line of the plurality of memory cells. Information about the first cell group, the second cell group, and the third cell group may be stored in a data latch (e.g., 151 in FIG. 1) of the page buffer (e.g., 150 in FIG. 1). Even while programming loops after the first programming loop Loop1 are being executed, the page buffer 150 may be divided into a first cell group, a second cell group, and a third cell group, and a bit line voltage may be applied thereto based on a result of the detection stored in the data latch 151.

During the execution of the first programming loop Loop1, a programming inhibition voltage may be applied to the bit line of the memory cells of the first cell group, a programming forcing voltage may be applied to a bit line of memory cells of the second cell group, and a bit line programming voltage may be applied to the bit line of the memory cells of the third cell group. The first programming pulse Vpgm1 may be applied to the word line of the plurality of memory cells. Although FIG. 7A shows that only one first programming pulse Vpgm1 is applied to the first programming loop Loop1, the present disclosure is not limited thereto. In the first programming loop Loop1, a plurality of programming pulses may be applied to the word line of the memory cells. Thus, a row decoder (e.g., 140 in FIG. 1) may provide the first programming pulse Vpgm1 to the word line of the plurality of memory cells while the first programming loop Loop1 is executed. When the row decoder 140 provides the first programming pulse Vpgm1, the page buffer 150 may provide a programming inhibition voltage to the bit line of the memory cells of the first cell group, a programming forcing voltage to the bit line of the memory cells of the second cell group, and a bit line programming voltage to the bit line of the memory cells of the third cell group.

In the first programming loop Loop1, after the first programming pulse Vpgm1 is applied to the word line of the plurality of memory cells, a second verifying operation, in which the first verifying voltage Vrf1 and the third verifying voltage Vrf3 are applied to the word line of the plurality of memory cells, may be performed. A level of the third verifying voltage Vrf3 may be the same as that of the second verifying voltage Vrf2, but the present disclosure is not limited thereto. In FIG. 7A, the third verifying voltage Vrf3 is applied after the first verifying voltage Vrf1 is applied. However, the present disclosure is not limited thereto, the third verifying voltage Vrf3 may be applied before the verifying voltage Vrf1 is applied. In another programming loop, the second verifying voltage Vrf2 or the third verify voltage Vrf3 may be not applied, and the first verify voltage Vrf1 may be applied As the first verifying voltage Vrf1 and the third verifying voltage Vrf3 are applied to the word line of the plurality of memory cells, by comparing a threshold voltage of each of the plurality of memory cells of the third cell group with the first verifying voltage Vrf1 and the third verifying voltage Vrf3, a memory cell having a threshold voltage higher than that of the first verifying voltage Vrf1 may be detected as the fourth cell group, and a memory cell having a threshold voltage lower than that of the third verifying voltage Vrf3 may be detected as the sixth cell group. A memory cell having a threshold voltage between the first verifying voltage Vrf1 and the third verifying voltage Vrf3 may be detected as the fifth cell group. Thus, operation S131 of FIG. 6B may be performed by applying the first verifying voltage Vrf1 and the third verifying voltage Vrf3 to the word line of the plurality of memory cells.

In the second programming loop Loop2, the programming inhibition voltage may be applied to the bit line of the memory cells of the first cell group, the second cell group, and the fourth cell group. The programming forcing voltage may be applied to the bit line of the memory cells of the fifth cell group. The bit line programming voltage may be applied to the bit line of the memory cells of the sixth cell group. The second programming pulse Vpgm2 having a level higher than the first programming pulse Vpgm1 may be applied to the word line of the plurality of memory cells.

Based on a result of performing the first verifying operation before the first programming loop Loop1, the programming inhibition voltage may be applied to the bit lines of the memory cells of the first cell group and the second cell group regardless of the second verifying operation of the first programming loop Loop1. Based on the information about the second cell group stored in the data latch 151, the page buffer 150 may apply the programming inhibition voltage to the bit line of the memory cells of the second cell group in the second programming loop Loop2.

According to an embodiment of the present disclosure, when the programming forcing voltage was applied to the bit line of the memory cells of the second cell group G2 when applying the first programming pulse Vpgm1 in the previous operation, the nonvolatile memory device may apply the programming inhibition voltage to the bit line and further applies the second programming pulse Vpgm2 to a word line so that the memory cells of the second cell group are not to be over-programmed. Thus, the nonvolatile memory device may prevent the memory cells of the second cell group from being over-programmed as the second programming pulse Vpgm2 is applied, thereby reducing a width of the threshold voltage distribution of the plurality of memory cells and improving accuracy of a programming operation.

Referring to FIG. 7B, a first verifying operation may be performed as a verifying voltage Vrf is applied to the word line of the plurality of memory cells before the first programming loop Loop1 is executed. In one embodiment, a level of the verifying voltage Vrf may be the same as that of the verification read voltage for the first programmed state.

When the verifying voltage Vrf is applied to the word line of the plurality of memory cells, a voltage level of the bit line of the plurality of memory cells may be reduced gradually through a developing operation. A degree of reduction of the bit line voltage level may vary depending on a level of a threshold voltage of each of the plurality of memory cells. A page buffer (e.g., 150 in FIG. 1) may sense a voltage level of each bit line at first and second points in time, which are different from each other, and may detect a plurality of memory cells by dividing them into a first cell group, a second cell group, and a third cell group. For example, memory cells sensed as an on-cell at the first point in time may be classified into the third cell group, memory cells sensed as an on-cell at the second point in time may be classified into the second cell group, and memory cells sensed as an off-cell at the first point in time may be classified into the first cell group.

Thus, operation S110 of FIG. 5B may be performed by applying the verifying voltage Vrf once to the word line of the plurality of memory cells. A result of the detection may be stored in a data latch (e.g., 151 in FIG. 1) of a page buffer (e.g., 150 in FIG. 1). Even while programming loops after the first programming loop Loop1 are being executed, the page buffer 150 may be divided into a first cell group, a second cell group, and a third cell group, and a bit line voltage may be applied thereto based on a result of the detection stored in the data latch 151.

During the execution of the first programming loop Loop1, the programming inhibition voltage may be applied to the bit line of the memory cells of the first cell group, the programming forcing voltage may be applied to the bit line of the memory cells of the second cell group, and the bit line programming voltage may be applied to the bit line of the memory cells of the third cell group. The first programming pulse Vpgm1 may be applied to the word line of the plurality of memory cells. Although FIG. 7B shows that only one first programming pulse Vpgm1 is applied to the first programming loop Loop1, the present disclosure is not limited thereto. In the first programming loop Loop1, a plurality of programming pulses may be applied to the word line of the memory cells.

In the first programming loop Loop1, after the first programming pulse Vpgm1 is applied to a word line of a plurality of memory cells, a second verifying operation, in which the verifying voltage Vrf is applied to the word line of the plurality of memory cells, may be performed. A level of the verifying voltage Vrf in the second verifying operation may be the same as that of the verifying voltage Vrf in the first verifying operation, but the present disclosure is not limited thereto.

Depending on when the verifying voltage Vrf is applied to the word line of the plurality of memory cells and the page buffer 150 senses the bit line of the plurality of memory cells, the memory cells of the third cell group may be detected as the fourth cell group, the fifth group, and the sixth cell group. Thus, operation S131 of FIG. 6B may be performed by applying the verifying voltage Vrf once to the word line of the plurality of memory cells.

In the second programming loop, based on a result of performing the first verifying operation before the first programming loop Loop1, the programming inhibition voltage may be applied to the bit lines of the memory cells of the first cell group and the second cell group regardless of a verifying operation of the first programming loop Loop1. Based on the information about the second cell group stored in the data latch 151, the page buffer 150 may apply the programming inhibition voltage to the bit line of the memory cells of the second cell group in the second programming loop Loop2.

Figure 8:
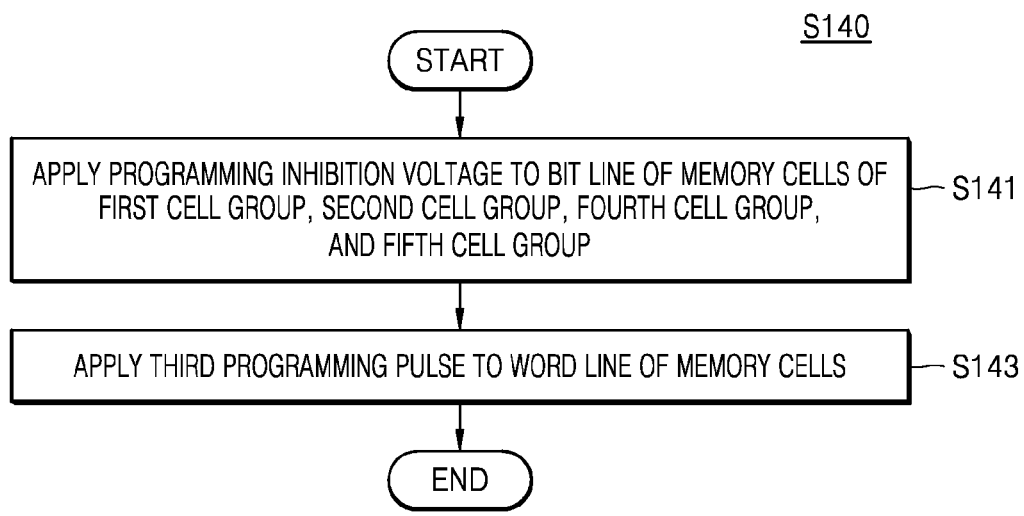
FIG. 8 is a flowchart illustrating a programming method of a nonvolatile memory device according to an embodiment of the present disclosure.

FIG. 8 is a flowchart illustrating operation S140 after operation S130 of FIG. 5B of a programming method of a nonvolatile memory device according to an embodiment of the present disclosure.

Referring to FIGS. 5A, 6A and 8, even after the second programming pulse Vpgm2 is applied to the plurality of memory cells MC1, the plurality of memory cells MC1 may not be programmed in the first programmed state P1. When memory cells of a reference value or more from among the plurality of memory cells MC1 are not included in the target distribution TP1, it can be determined that the plurality of memory cells MC1 are not programmed in the first programmed state P1. For example, when a threshold voltage of the memory cells of a reference value or more is equal to or lower than the verification read voltage Vv1, the memory cells may be seen as not being programmed in the first programmed state P1.

In operation S141, a page buffer (e.g., 150 in FIG. 1) may apply a programming inhibition voltage to the bit line of the memory cells of the first cell group G1, the second cell group G2, the fourth cell group G4, and the fifth cell group G5. The sixth cell group G6 is divided into three cell groups based on a threshold voltage, and the programming inhibition voltage, a programming forcing voltage, and a bit line programming voltage may be applied to the bit line, respectively. In operation S143, a third programming pulse may be applied to the word line of the plurality of memory cells MC1. A level of the third programming pulse may be higher than that of the second programming pulse. Therefore, threshold voltage distribution of some memory cells of the sixth cell group G6 may move to the right, and the plurality of memory cells MC1 may be programmed in the first programmed state P1. Although the drawings show only a case where the first programming pulses, the second programming pulses and the third programming pulses are applied to the word line of the plurality of memory cells MC1, the nonvolatile memory device and a method of programming the same according to the present disclosure are not limited thereto. The number of times program pulses are applied may be adjusted depending on a degree of programming the plurality of memory cells.

Figure 9:
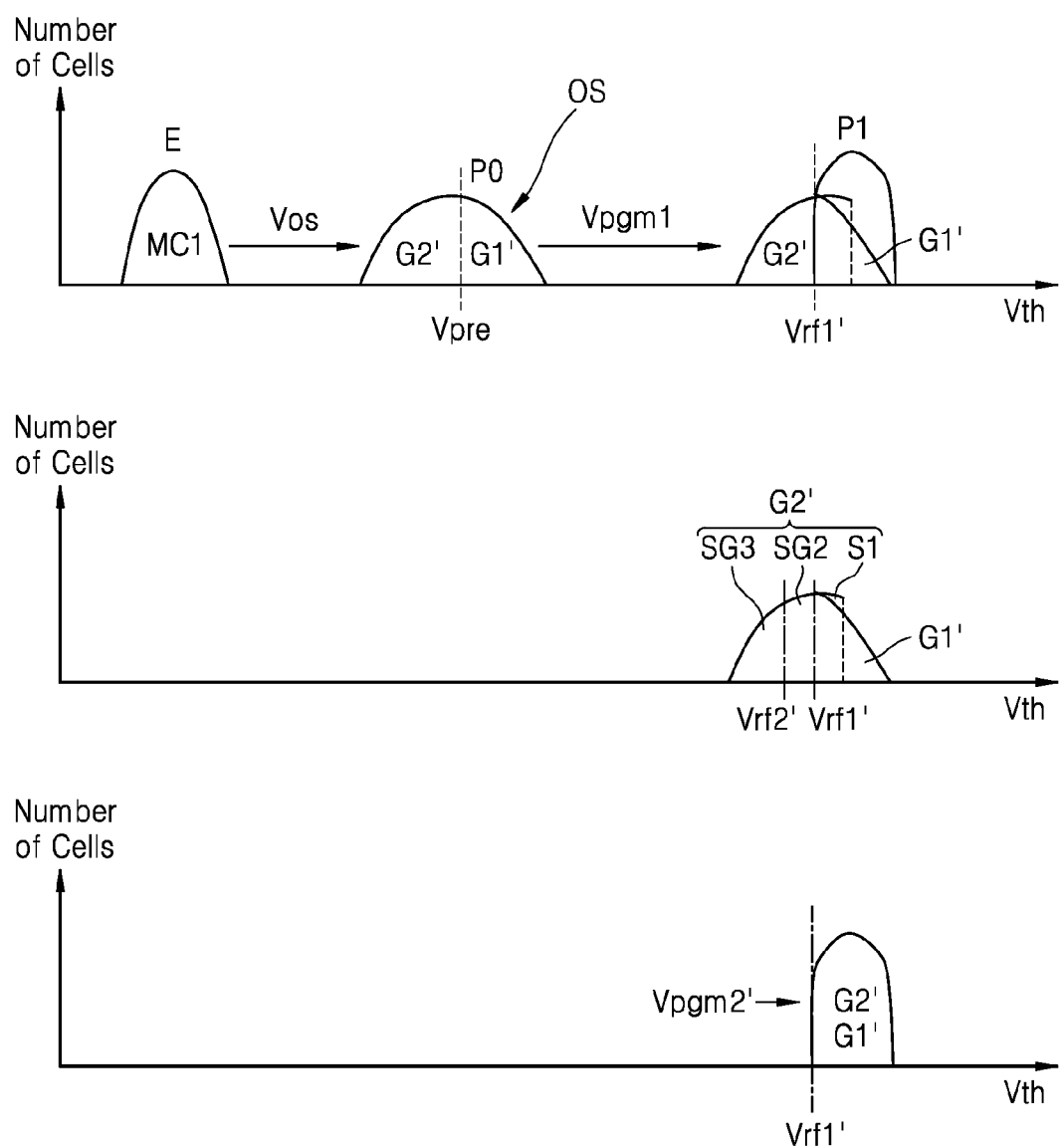
FIG. 9 is a graph illustrating operations of a programming method of a nonvolatile memory device according to another embodiment of the present disclosure.

FIG. 9 is a graph illustrating operations of a programming method of a nonvolatile memory device according to another embodiment of the present disclosure.

Referring to FIG. 9, a nonvolatile memory device may include the plurality of memory cells MC1 to be programmed in the first programmed state P1.

A pre-programmed distribution OS refers to distribution of a threshold voltage of memory cells MC1 generated when pre-programming pulse Vos is applied to a selected word line. When the pre-programming pulse Vos is applied to the word line of the plurality of memory cells MC1 in a state E, threshold voltage distribution of memory cells connected to the word line, that is, the pre-programmed distribution OS, may have Gaussian distribution, as shown in FIG. 9.

The nonvolatile memory device may program the memory cells of the selected word line in a pre-programmed state P0 by applying a pre-programming pulse Vos to the word line. Based on a pre-verifying voltage Vpre, the memory device may count the number of the memory cells programmed in the pre-programmed state P0, i.e., off cells for the pre-programmed state P0.

The pre-programmed state P0 may be a state located between the erased state E and the first programmed state P1. The pre-programmed state P0 is not a state corresponding to multi-bit data stored in the memory cells.

In one embodiment, the number of off-cells in the counted pre-programmed state may correspond to the programming speed of the word line. For example, the greater the number of the off-cells, the faster the programming speed may be. However, the present invention is not limited thereto, the number of off-cells in the counted pre-programmed state may vary by different conditions. In one embodiment, based on the pre-verifying voltage Vpre, the memory cells MC1 that are programmed in the pre-programmed state P0 may be divided into a first cell group G1' and memory cells that are not programmed in the pre-programmed state P0 may be divided into a second cell group G2'.

In order to reduce a width of the pre-programmed distribution OS of the plurality of memory cells, the programming forcing voltage is applied to a bit line of the first cell group G1', the bit line programming voltage is applied to a bit line of the second cell group G2', and a first programming pulse Vpgm1' may be applied to the word line of the plurality of memory cells. Therefore, threshold voltage distribution of memory cells of the first cell group G1' and the second cell group G2' moves to the right by the first programming pulse Vpgm1', and a width of the threshold voltage distribution may be reduced.

After the first programming pulse Vpgm1' is applied to the word line of the plurality of memory cells MC1, memory cells of the second cell group G2' may be divided into three groups based on a threshold voltage of the memory cells of the second cell group G2'. The memory cells of the second cell group G2' may be divided into a first sub-cell group SG1, a second sub-cell group SG2, and a third sub-cell group SG3 by verifying the memory cells based on a first verifying voltage Vrf1' and a second verifying voltage Vrf2'. In one embodiment, the first verifying voltage Vrf1' may be the same as a verification read voltage for the first programmed state P1 for verifying whether the plurality of memory cells MC1 are normally programmed in the first programmed state P1. In one embodiment, a threshold voltage of memory cells of the first cell group G1' may be equal to or higher than the first verifying voltage Vrf1' after the first programming pulse Vpgm1' is applied. However, the present invention is not limited thereto.

The programming inhibition voltage may be applied to a bit line of the memory cells of the first cell group G1' and the first sub-cell group SG1, the programming forcing voltage may be applied to a bit line of memory cells of the second cell group SG2, and the bit line programming voltage may be applied to a bit line of memory cells of the third cell group SG3. A second programming pulse Vpgm2' may be applied to the word line of the plurality of memory cells MC1.

According to an embodiment of the present disclosure, regardless of the verifying operation, the nonvolatile memory device may apply the programming inhibition voltage to the bit line of the memory cells of the first cell group G1' in which the programming forcing voltage was applied to a bit line in the previous operation, to prevent the memory cells of the first cell group G1' from being programmed due to the second programming pulse Vpgm2'. Therefore, it is possible to prevent the memory cells of the first cell group G1' from being over-programmed beyond the first programmed state P1.

Distribution of the memory cells of the second sub-cell group SG2 and the third sub-cell group SG3 moves to the right as the second programming pulse Vpgm2' is applied, and the plurality of memory cells MC1 may be programmed in the first programmed state P1.

Figure 10:
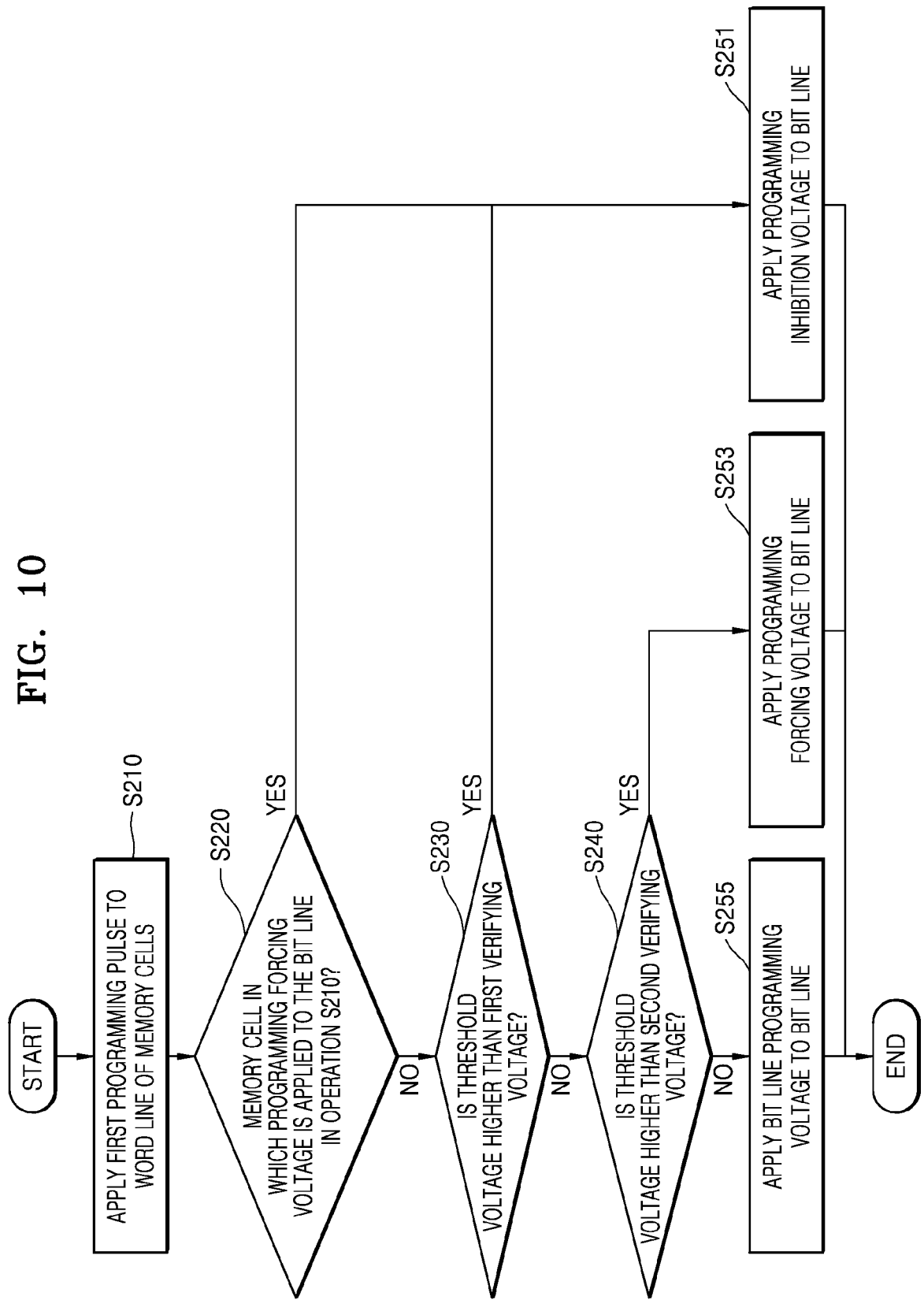
FIG. 10 is a flowchart illustrating a method of programming a nonvolatile memory device according to an embodiment of the present disclosure.

FIG. 10 is a flowchart illustrating a method of programming a nonvolatile memory device according to an embodiment of the present disclosure.

Referring to FIGS. 1 and 10, in operation S210, a first programming pulse may be applied to a word line of a plurality of memory cells to be programmed in a first programmed state. In at least some of the plurality of memory cells, the programming forcing voltage may be applied to a bit line and the first programming pulse may be applied to the word line. The at least some memory cells may be memory cells included in the second cell group G2 of FIG. 5A, or may be memory cells included in the first cell group G1' of FIG. 9. Information about the at least some memory cells may be stored in the data latch 151.

In operation S220, based on the information about the at least some memory cells stored in the data latch 151, the control logic unit 120 may confirm which of the plurality of memory cells is the memory cell in which the programming forcing voltage is applied to the bit line in operation S210. When the memory cell in which the programming forcing voltage is applied to the bit line is confirmed, the control logic unit 120 may control the page buffer 150 such that a programming inhibition voltage is applied to the bit line in operation S251. Therefore, it is possible to prevent the memory cell to which the programming forcing voltage is applied from being programmed due to the second programming pulse.

In one embodiment, as described in FIG. 7A, the control logic unit 120 may control the voltage generator 130 and the row decoder 140 to divide the plurality of memory cells into three groups of cells, and may apply the first and second verifying voltages. A level of the first verifying voltage may be the same as that of a verification read voltage for the first programmed state and a level of the second verifying voltage may be lower than that of the first verifying voltage.

In another embodiment, as described in FIG. 7B, the control logic unit 120 may control the voltage generator 130 and the row decoder 140 to apply a single verifying voltage, and may further divide the plurality of memory cells into three groups of cells by varying time for sensing a bit line voltage in the page buffer 150.

When there is no memory cell in which the programming forcing voltage is applied to the bit line in operation S210, in operation S230, the control logic unit 120 may compare the first verifying voltage and the second verifying voltage with a threshold voltage of the plurality of memory cells to confirm whether the threshold voltage of the plurality of memory cells is higher than the first verifying voltage. Since a memory cell having a threshold voltage higher than the first verifying voltage has already been programmed in the first programmed state, in operation S251, the programming inhibition voltage is applied to the bit line, thereby preventing programming due to the second programming pulse.

In operation S240, a threshold voltage of a memory cell that is less than the first verifying voltage may be confirmed to be higher than the second verifying voltage. In operation S253, in a case of a memory cell having a threshold voltage higher than the second verifying voltage, the programming forcing voltage may be applied to the bit line to prevent the memory cell from being over-programmed due to the second programming pulse.

In operation S255, in a case of a memory cell having a threshold voltage less than the second verifying voltage, the bit line programming voltage may be applied to program the memory cell in the first programmed state.

According to an embodiment of the present disclosure, when a programming pulse is applied in a previous operation, the nonvolatile memory device subsequently applies the programming inhibition voltage to the bit line for the memory cells in which the programming forcing voltage was applied to the bit line, regardless of a verifying operation, thereby preventing over-programming by the subsequent programming operation. A width of threshold voltage distribution of the plurality of memory cells may be reduced, and accuracy of the programming operation may be improved.

Figure 11:
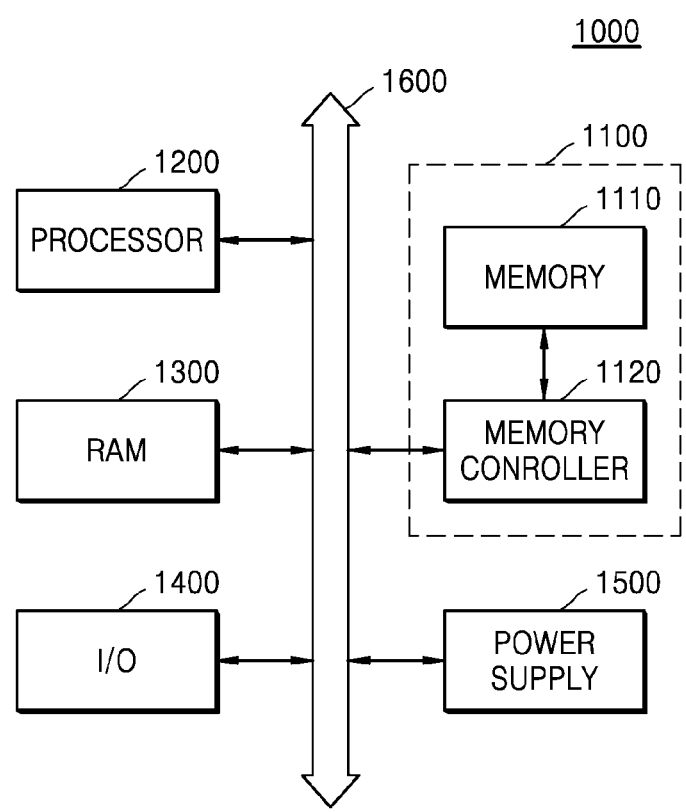
FIG. 11 is a block diagram illustrating a computing system including a nonvolatile memory device according to embodiments of the present disclosure.

FIG. 11 is a block diagram illustrating a computing system 1000 including a nonvolatile memory device according to embodiments of the present disclosure.

Referring to FIG. 11, the computing system 1000 may include a memory system 1100, a processor 1200, RAM 1300 (random-access memory), an input/output device 1400, and a power supply 1500. Although not shown in FIG. 11, the computing system 1000 may further include ports capable of communicating with video cards, sound cards, memory cards, universal serial bus devices, or other electronic devices. The computing system 1000 may be implemented as a personal computer (PC) or a portable electronic device such as a laptop computer, a mobile phone, a personal digital assistant (PDA), and a camera.

The processor 1200 may perform certain calculations or tasks. According to an embodiment, the processor 1200 may be a micro-processor or a central processing unit (CPU). The processor 1200 may communicate with the RAM 1300, the input/output device 1400, and the memory system 1100 via a bus 1600 such as an address bus, a control bus, and a data bus. The processor 1200 may also be connected to an expansion bus, such as a peripheral component interconnect (PCI) bus.

The memory system 1100 may include a nonvolatile memory device 1110 implemented using the embodiments shown in FIGS. 1 to 10. Depending on embodiments, accuracy of an operation of programming the nonvolatile memory device 1110 in a specific programmed state may be improved.

The RAM 1300 may store data necessary for an operation of the computing system 1000. For example, the RAM 1300 may be implemented as dynamic random-access memory (DRAM), mobile DRAM, static RAM (SRAM), phase-change RAM (PRAM), ferroelectric RAM (FRAM), resistive RAM, and/or magnetic RAM (MRAM).

The input/output device 1400 may include input units such as a keyboard, a keypad, a mouse, etc., and output units such as a printer, a display, and the like. The power supply 1500 may supply an operating voltage necessary for the operation of the computing system 1000.

While the inventive concepts described in the present disclosure have been particularly shown and described with reference to example embodiments thereof, it will be understood that various changes in form and details may be made therein without departing from the spirit and scope of the following claims.

What is claimed is:

1. A method of programming a nonvolatile memory device including a plurality of memory cells that include first memory cells and second memory cells having a threshold voltage lower than that of the first memory cells, the first memory cells and the second memory cells having a same target programmed state, the method comprising:
   performing first programming by applying a programming forcing voltage to a bit line of each of the first memory cells;
   dividing the second memory cells into a first cell group, a second cell group, and a third cell group, based on the threshold voltage of the second memory cells after performing the first programming; and
   performing second programming by applying a programming inhibition voltage to the bit line and a bit line of each memory cell of the first cell group of the second memory cells,
   wherein a level of the programming forcing voltage is lower than that of the programming inhibition voltage.

2. The method of claim 1, wherein the performing of the first programming comprises:
   dividing the plurality of memory cells into the first memory cells and the second memory cells, based on the threshold voltage of the first memory cells and the threshold voltage of the second memory cells; and
   applying a bit line programming voltage to the bit line of each of the second memory cells.

3. The method of claim 1, wherein the plurality of memory cells further comprises third memory cells having a threshold voltage higher than that of the second memory cells and having the same target programmed state, and
   the performing of the first programming comprises:

dividing the plurality of memory cells into the first memory cells, the second memory cells, and the third memory cells, based on the threshold voltage of the first memory cells, the threshold voltage of the second memory cells, and a threshold voltage of the third memory cells; and applying the programming inhibition voltage to a bit line of each of the third memory cells.

4. The method of claim 3, wherein the performing of the second programming comprises:

applying the programming inhibition voltage to the bit line of each of the third memory cells.

5. The method of claim 1, wherein the first programming comprises applying a first programming pulse to a word line of the plurality of memory cells, the second programming comprises applying a second programming pulse to the word line of the plurality of memory cells, and a level of the second programming pulse is higher than that of the first programming pulse.

6. The method of claim 1, wherein the performing of the second programming comprises:

applying the programming forcing voltage to a bit line of each of the second memory cells of the second cell group, and a bit line programming voltage to a bit line of each of the second memory cells of the third group, wherein a level of the bit line programming voltage is lower than that of the programming forcing voltage.

7. A method of programming a nonvolatile memory device including a plurality of memory cells that have a same target programmed state and are divided into a first cell group, a second cell group and a third cell group according to a level of a threshold voltage, the method comprising:

performing first programming by applying a first programming pulse to a word line of the plurality of memory cells, wherein performing first programming comprises:

applying a programming inhibition voltage to a bit line of each of memory cells of the first cell group;

applying a programming forcing voltage having a level lower than the programming inhibition voltage to a bit line of each of memory cells of the second cell group; and applying a bit line programming voltage having a level lower than the programming forcing voltage to a bit line of each of memory cells of the third cell group; and performing second programming by applying a programming inhibition voltage to bit lines of the memory cells of the first cell group and the second cell group and then applying a second programming pulse to the word line of the plurality of memory cells.

8. The method of claim 7, wherein a threshold voltage of the first cell group is higher than a threshold voltage of the second cell group and the threshold voltage of the second cell group is higher than a threshold voltage of the third cell group.

9. The method of claim 7, wherein the performing of the second programming comprises:

dividing memory cells of the third cell group into a fourth cell group, a fifth cell group, and a sixth cell group based on a threshold voltage of the memory cells of the third cell group after the first programming;

applying the programming inhibition voltage to a bit line of each of the memory cells of the first cell group, the second cell group, and the fourth cell group; and applying the programming forcing voltage to a bit line of each of memory cells of the fifth cell group.

10. The method of claim 9, further comprising:

performing third programming by applying a third programming pulse to the word line of the plurality of memory cells, wherein performing the third programming comprises:

applying the programming inhibition voltage to the bit line of each of the memory cells of the first cell group, the second cell group, and the fourth cell group, and a bit line of each of the memory cells of the fifth cell group.

11. The method of claim 10, wherein a level of the third programming pulse is higher than a level of the second programming pulse, and the level of the second programming pulse is higher than a level of the first programming pulse.

12. The method of claim 7, further comprising:

applying a verifying voltage to the word line of the plurality of memory cells to divide the plurality of memory cells into the first cell group, the second cell group, and the third cell group.

13. The method of claim 12, wherein the applying of the verifying voltage comprises:

applying a first verifying voltage and a second verifying voltage having different voltage levels to the word line of the plurality of memory cells.

14. The method of claim 13, wherein a level of the first verifying voltage is equal to a level of a verification read voltage for a target programmed state of the plurality of memory cells.

15. A nonvolatile memory device, comprising:

a cell array including a plurality of memory cells including first memory cells and second memory cells, wherein the first memory cells and the second memory cells have a same target programmed state;

a row decoder configured to provide a first programming pulse to a word line of the plurality of memory cells in a first programming loop and a second programming pulse to a word line of the plurality of memory cells in a second programming loop;

a page buffer configured to provide a programming inhibition voltage, a programming forcing voltage, and a bit line programming voltage to bit lines of the plurality of memory cells; and a control logic unit configured to control the row decoder and the page buffer such that the first programming loop and the second programming loop are sequentially performed, wherein the control logic unit is configured to control the page buffer by applying the programming forcing voltage to a bit line of each of the first memory cells in the first programming loop, and by applying the programming inhibition voltage to the bit line of each of the first memory cells in the second programming loop, and wherein the programming forcing voltage has a level lower than a level of the programming inhibition voltage, and the bit line programming voltage has a level lower than the level of the programming forcing voltage.

16. The nonvolatile memory device of claim 15, wherein the page buffer includes a data latch, and the data latch stores information about the first memory cells.

17. The nonvolatile memory device of claim 15, wherein the control logic unit is configured to control the row decoder such that a verifying voltage is applied to a word line of the second memory cells having a threshold voltage lower than that of the first memory cells, in the second programming loop.

18. The nonvolatile memory device of claim 17, wherein the page buffer is configured to sense a change in a bit line voltage of each of the second memory cells according to a verifying voltage applied to the word line of the second memory cells at each of a first point in time and a second point in time, and
   the second memory cells are divided into a first cell group, a second cell group, and a third cell group based on a sensing result of the page buffer.

19. The nonvolatile memory device of claim 17, wherein the control logic unit is configured to control the row decoder to sequentially apply a first verifying voltage and a second verifying voltage to the word line of the second memory cells in the first programming loop,
   the page buffer is configured to sense a change in a bit line voltage of the second memory cells according to each of the first verifying voltage and the second verifying voltage applied to the word line of the second memory cells, and
   the second memory cells are divided into a first cell group, a second cell group, and a third cell group based on a sensing result of the page buffer.

20. The nonvolatile memory device of claim 17, wherein a level of a threshold voltage of the first memory cells is higher than that of a threshold voltage of the second memory cells.

* * * * *